(12) United States Patent
Shen et al.

(10) Patent No.: US 12,364,082 B2
(45) Date of Patent: Jul. 15, 2025

(54) LED DIE HAVING CENTRALLY PEAKED SURFACE LUMINANCE

(71) Applicant: Lumileds LLC, San Jose, CA (US)

(72) Inventors: Yu-Chen Shen, Sunnyvale, CA (US); Jeffrey Vincent DiMaria, San Jose, CA (US); Florent Gregoire Monestier, Kerkrade (NL); Antonio Lopez Julia, Vaals (NL)

(73) Assignee: Lumileds LLC, San Jose, CA (US)

( * ) Notice: Subject to any disclaimer, the term of this patent is extended or adjusted under 35 U.S.C. 154(b) by 439 days.

(21) Appl. No.: 17/989,223

(22) Filed: Nov. 17, 2022

(65) Prior Publication Data
US 2023/0170452 A1     Jun. 1, 2023

Related U.S. Application Data

(60) Provisional application No. 63/284,982, filed on Dec. 1, 2021.

(51) Int. Cl.
*H10H 20/857* (2025.01)
*H10H 20/81* (2025.01)
(Continued)

(52) U.S. Cl.
CPC .......... *H10H 20/857* (2025.01); *H10H 20/81* (2025.01); *H10H 20/813* (2025.01); *H10H 20/8312* (2025.01); *H10H 29/142* (2025.01)

(58) Field of Classification Search
CPC ............. H10H 20/8312; H10H 29/142; H10H 20/813; F21S 41/657; F21S 41/60
See application file for complete search history.

(56) References Cited

U.S. PATENT DOCUMENTS

| 9,412,907 B1 * | 8/2016 | Place ................... H10H 20/813 |
| 2007/0091602 A1 | 4/2007 | Van Voorst Vader et al. |

(Continued)

FOREIGN PATENT DOCUMENTS

| CN | 104272478 | 1/2015 |
| CN | 110931611 | 3/2020 |

(Continued)

OTHER PUBLICATIONS

"International Application Serial No. PCT/US2022/050248, International Search Report mailed Mar. 15, 2023", 6 pgs.

(Continued)

*Primary Examiner* — Alia Sabur
(74) *Attorney, Agent, or Firm* — Schwegman, Lundberg & Woessner, P.A.

(57) ABSTRACT

A light-emitting diode (LED) die can include a p-n junction between a p-doped semiconductor material and an n-doped semiconductor material. The LED die can include vias that can electrically power the p-n junction. The vias can optionally be electrically connected in parallel to one another. A controller can supply current to the vias to electrically power the LED die. The vias can be distributed with a density that peaks at or near a center of the LED die and decreases with increasing distances away from the peak of the density, such that when the vias are electrically powered, the LED die emits light with a surface luminance that peaks at or near the center of the LED die and decreases with increasing distances away from the peak of the surface luminance.

20 Claims, 4 Drawing Sheets

(51) Int. Cl.
*H10H 20/813* (2025.01)
*H10H 20/831* (2025.01)
*H10H 29/14* (2025.01)

(56) References Cited

U.S. PATENT DOCUMENTS

| | | |
|---|---|---|
| 2007/0211449 A1 | 9/2007 | Holman et al. |
| 2011/0305021 A1* | 12/2011 | Xin ...................... H10H 20/857 |
| | | 362/249.02 |
| 2012/0051075 A1* | 3/2012 | Harada .............. H10H 20/8516 |
| | | 362/510 |
| 2012/0051079 A1* | 3/2012 | Saito .................... F21S 41/148 |
| | | 362/538 |
| 2012/0181568 A1 | 7/2012 | Hsia et al. |
| 2012/0193662 A1 | 8/2012 | Donofrio et al. |
| 2013/0264592 A1 | 10/2013 | Bergmann et al. |
| 2017/0033262 A1* | 2/2017 | Takenaga .............. H10H 20/851 |
| 2017/0210277 A1* | 7/2017 | Harada ................. F21S 41/153 |
| 2018/0151778 A1* | 5/2018 | Park ....................... H10H 20/83 |
| 2021/0028330 A1* | 1/2021 | Furuha .................. H10H 29/10 |

FOREIGN PATENT DOCUMENTS

| | | | | |
|---|---|---|---|---|
| EP | 3182451 A1 * | 6/2017 | ......... | H01L 25/0753 |
| KR | 20210051205 A | 5/2021 | | |

OTHER PUBLICATIONS

"International Application Serial No. PCT/US2022/050248, Written Opinion mailed Mar. 15, 2023", 4 pgs.

* cited by examiner

LED DIE HAVING CENTRALLY PEAKED SURFACE LUMINANCE

CROSS-REFERENCE TO RELATED APPLICATION

This application claims the benefit of U.S. Provisional Application No. 63/284,982, filed on Dec. 1, 2021, the entirety of which is hereby incorporated by reference herein.

FIELD OF THE DISCLOSURE

The present disclosure relates to a light-emitting diode (LED) die, and an illumination system and method that uses such a die.

BACKGROUND OF THE DISCLOSURE

Illumination systems can use LEDs to provide light to a scene. There is ongoing effort to improve illumination systems, such as by reducing wasted light and/or reducing optical materials in components of the illumination systems.

BRIEF DESCRIPTION OF THE DRAWINGS

Corresponding reference characters indicate corresponding parts throughout the several views. Elements in the drawings are not necessarily drawn to scale. The configurations shown in the drawings are merely examples and should not be construed as limiting in any manner.

DETAILED DESCRIPTION

Figure 1:
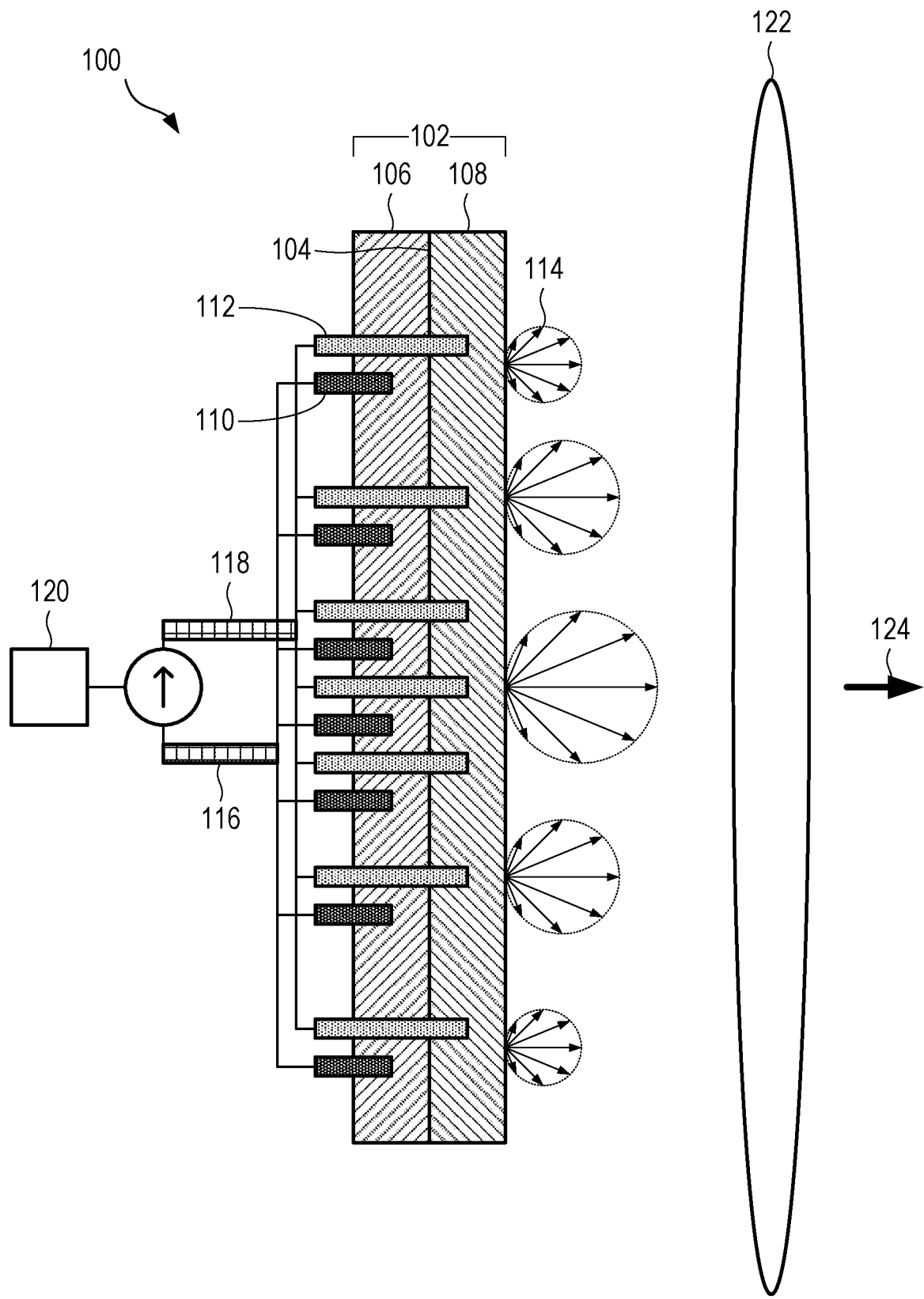
FIG. 1 shows a side view of an example of an illumination system, in accordance with some examples.

In some optical systems, e.g., automotive optical systems such as vehicle headlights, it is found that light emerging from corners of a square or rectangular LED die may not contribute significantly to a figure of merit for the optical system. (A figure of merit can be a quantity that is maximized or minimized during the design phase of an optical system, such as a root-mean-square spot size, a modulation transfer at a specified spatial frequency, a detector signal, a Strehl ratio, and others.) For example, for a vehicular headlight, light from the corners of the LED die may arrive at a location away from a target location of the vehicular headlight. As a result, utilizing the corners of a square or rectangular LED die can waste optical materials (e.g., the semiconductor materials that form the corners of the LED die) and electrical power (e.g., from the current that passes through the corners of the LED die and causes the light to be produced in the corners of the LED die).

To help reduce the wasted optical materials and electrical power, an LED die can be shaped to reduce or eliminate surface area that corresponds to the corners of the square or rectangle. Because an LED die can be manufactured at the wafer level by a singulation process that can involve scribing, scoring, breaking, dicing, laser ablation, and/or another suitable step that can involve straight lines, the manufacturing process is suitable for polygonal LED die shapes. For example, the LED die can be shaped as a pentagon, a heptagon, an octagon, a nonagon, a decagon, or another n-sided polygon, where n is greater than or equal to five.

In some examples, it is found that a hexagonal LED die, such as a regular hexagonal LED die (e.g., a hexagonal LED die in which the hexagon is both equilateral and equiangular), can use less optical materials than a comparable square or rectangular LED die and can operate on less electrical power than the comparable square or rectangular LED die. Further, because regular hexagons can be tiled to efficiently fill an area of a plane, such as an area of a wafer, shaping the LED as a regular hexagon can avoid wasting material (e.g., the material that would not be included with an LED die if the LED dies were shaped as an n-sided polygon, where n is five or greater than or equal to seven).

In addition to shaping the LED die in a particular manner, the electrical connections of the LED die can be adjusted so that the surface luminance forms a peak, such as at or near a center of the LED die, and decreases at increasing distances away from the peak. Compared with LED die contacts that extend over a full surface area or nearly full surface area of the LED die, which can produce a generally uniform surface luminance over the surface area of the LED die, the LED die can include a plurality of vias that can be non-uniformly distributed over a surface area of the LED die. To produce a peak in surface luminance, such as at the center of the LED die, the vias can be distributed to have a higher density at a peak location, such as at the center of the LED die, and a lower density away from the peak location.

Shaping the LED die in this manner and forming the electrical connections for the die in this manner can be used with vertical thin film (VTF), embedded contact vertical thin film, chip scale package (CSP), thin film flip chip (TFFC), or other suitable die types.

FIG. 1 shows a side view of an example of an illumination system 100, in accordance with some examples.

The illumination system 100 can include a light-emitting diode (LED) die 102. The LED die 102 can include a p-n junction 104 between a p-doped semiconductor material 106 and an n-doped semiconductor material 108. The LED die 102 can include a plurality of p-vias 110 that electrically contact the p-doped semiconductor material 106. The LED die 102 can include a plurality of n-vias 112 that electrically contact the n-doped semiconductor material 108. The p-n junction 104 can be formed on a substrate, such as a sapphire substrate, which is omitted in FIG. 1 for clarity.

The plurality of p-vias 110 and the plurality of n-vias 112 can be distributed non-uniformly over a surface area of the LED die 102, such that when the plurality of p-vias 110 and the plurality of n-vias 112 are electrically powered, the LED die 102 can emit light with a surface luminance that varies non-uniformly over the surface area of the LED die 102.

In some examples, the p-vias 110 of the plurality of p-vias 110 and the n-vias 112 of the plurality of n-vias 112 can be distributed over the surface area of the LED die 102 with a density that peaks at or near a center (e.g. within 5% of a diameter of the LED die 102, within 10% of the diameter of the LED die 102, or within 20% of the diameter of the LED die 102) of the LED die 102 and decreases with increasing distance away from the peak of the density, such that when the plurality of p-vias 110 and the plurality of n-vias 112 are electrically powered, the LED die 102 can emit light with a surface luminance 114 that peaks at or near the center of the LED die 102 and decreases with increasing distance away from the peak of the surface luminance 114.

In some examples, the p-vias 110 of the plurality of p-vias 110 and the n-vias 112 of the plurality of n-vias 112 can be distributed over the surface area of the LED die 102 in an equilateral triangular pattern.

In some examples, the p-vias 110 of the plurality of p-vias 110 can be distributed over the surface area of the LED die 102 such that a separation between adjacent p-vias 110 varies across the LED die 102 by a value greater than or equal to 15% of a smallest p-via separation value, greater than or equal to 10% of a smallest p-via separation value, or greater than or equal to 20% of a smallest p-via separation value. Simulation of the LED die 102 has shown that the value of 15% (or about 15%, such as 10% or 20%) can provide a reasonable compromise between reducing a surface area of the LED die 102 (and therefore reducing materials and electrical power) and maintaining a suitable high figure of merit in optical systems that use the LED die 102.

In some examples, the n-vias 112 of the plurality of n-vias 112 can be distributed over the surface area of the LED die 102 such that a separation between adjacent n-vias 112 varies across the LED die 102 by a value greater than or equal to 15% of a smallest n-via separation value, greater than or equal to 10% of a smallest n-via separation value, or greater than or equal to 20% of a smallest n-via separation value.

In some examples, a perimeter of the LED die 102 can lack electrical connections, such as p-vias 110 and n-vias 112. For example, an area around the perimeter to within 1%, 5%, or 10% of a diameter of the LED die 102.

In some examples, the p-vias 110 of the plurality of p-vias 110 can be electrically connected in parallel to one another. The LED die 102 can include a central p-contact pad 116 that can be located proximate a center of the LED die 102 (e.g. separated by the center by less than 1%, 5%, or 10% of the diameter of the LED die 102) and can deliver current to the p-vias 110 of the plurality of p-vias 110. In some examples, the central p-contact pad 116 can direct heat away from the LED die 102.

In some examples, the n-vias 112 of the plurality of n-vias 112 can be electrically connected in parallel to one another. The LED die 102 can include a central n-contact pad 118 that can be located proximate a center of the LED die 102 and can deliver current to the n-vias 112 of the plurality of n-vias 112. In some examples, the central n-contact pad 118 can direct heat away from the LED die 102.

In some examples, such as the configuration shown in FIG. 1, the LED die 102 can use p-vias 110 to supply current to the p-doped semiconductor material 106. Alternatively, the LED die 102 can use one or more contact pads, which are larger than the vias, to provide current to a larger area of the p-doped semiconductor material than can be accessed by each p-via. In some examples, the LED die 102 can use a large electrical contact, such as extending over a full surface area or nearly full surface area of the LED die 102, to supply current to the entire p-doped semiconductor material 106.

In some examples, such as the configuration shown in FIG. 1, the LED die 102 can use n-vias to supply current to the n-doped semiconductor material 108. Alternatively, the LED die 102 can use one or more contact pads, which are larger than the vias, to provide current to a larger area of the n-doped semiconductor material 108 than can be accessed by each n-via. In some examples, the LED die 102 can use a large electrical contact, such as extending over a full surface area or nearly full surface area of the LED die 102, to supply current to the entire n-doped semiconductor material 108.

Figure 2:
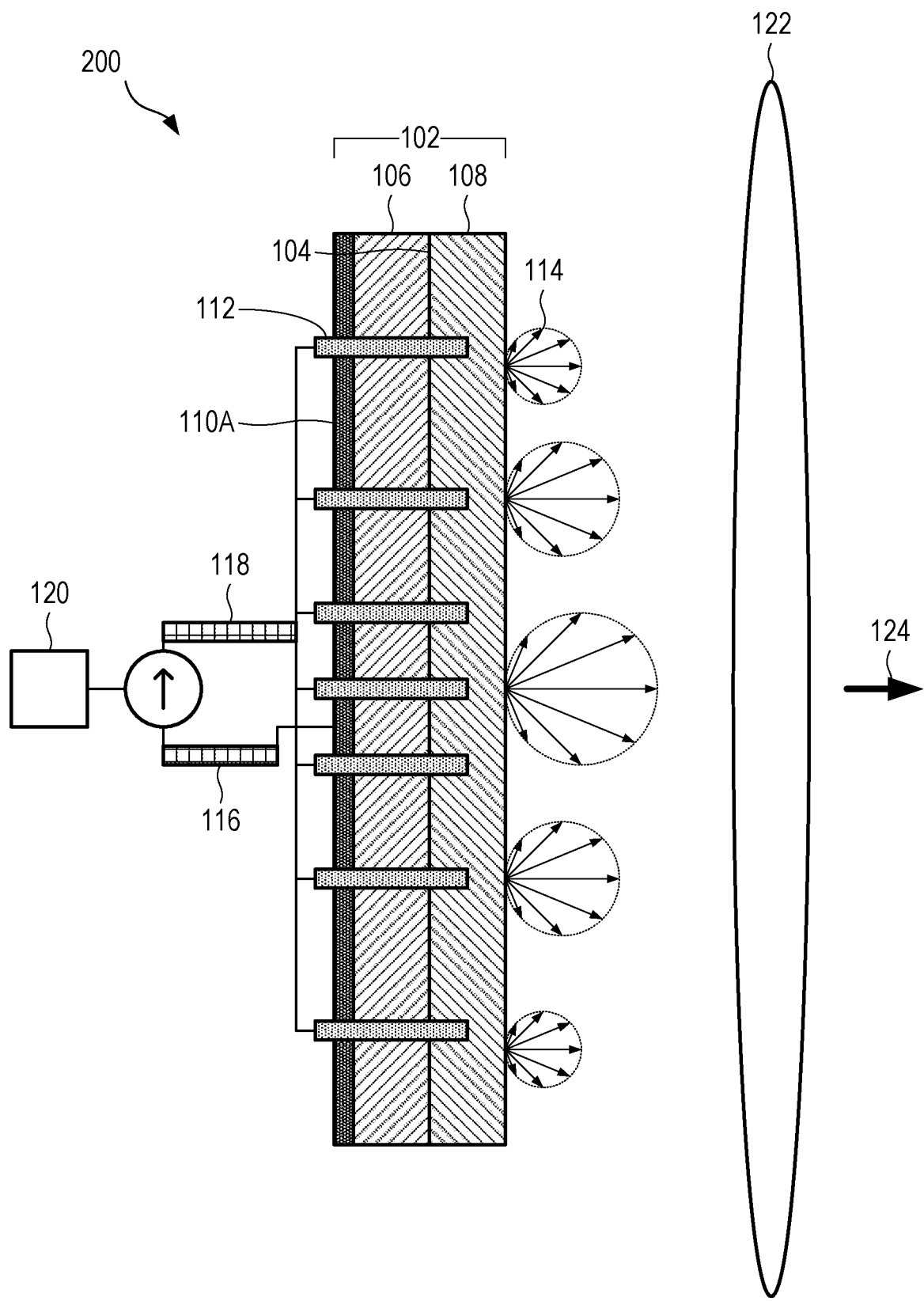
FIG. 2 shows a side view of an example of an illumination system, in accordance with some examples.

FIG. 2 shows a side view of an example of an illumination system 200, in accordance with some examples. Compared with the illumination system 100 of FIG. 1, the illumination system 200 replaces the p-vias 110 with an electrically conducting layer 110A that electrically contacts the p-doped semiconductor material 106. The electrically conducting layer 110A can extend at least partially over a surface area of the LED die 102, such that when the plurality of p-vias 110 are electrically powered, current flows through the p-n junction 104 between the electrically conducting layer 110A and the plurality of n-vias 112.

As a further alternative, the locations of the p-doped semiconductor material 106 and the n-doped semiconductor material 108 can be swapped, such that the electrically conducting layer 110A can electrically contact the n-doped semiconductor material 108, the vias are p-vias that electrically contact the p-doped semiconductor material 106, and light exits the LED die 102 from the p-doped semiconductor material 106.

Figure 3:
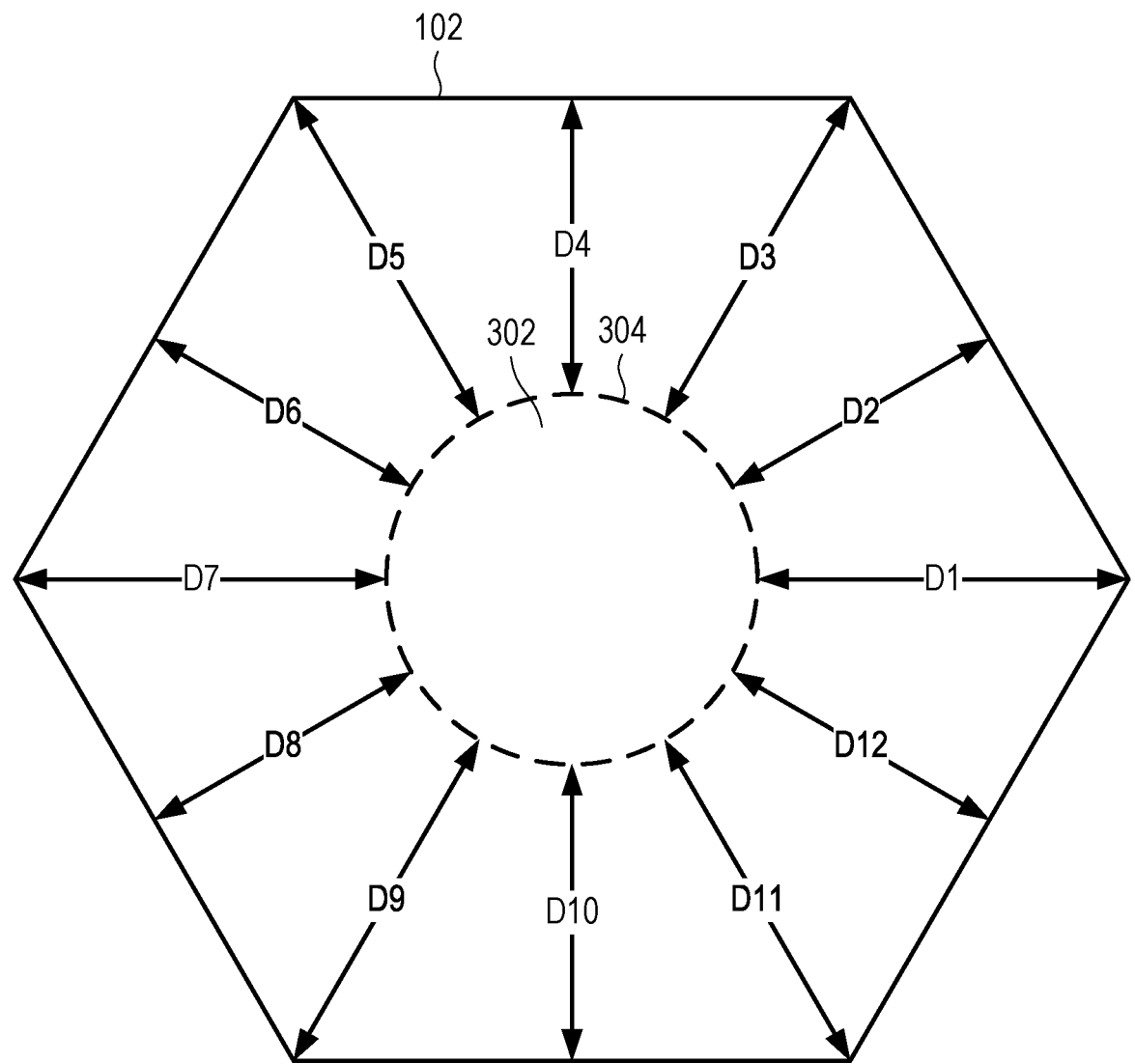
FIG. 3 shows a front view of the LED die of FIGS. 1 and 2, in accordance with some examples.

FIG. 3 shows a front view of the LED die 102 of FIGS. 1 and 2, in accordance with some examples.

In some examples, the surface area of the LED die 102 can be a hexagon, such as an equilateral hexagon, an equiangular hexagon, or a regular hexagon. Alternatively, other shapes can be used, including n-sided polygons, where n is an integer of five or greater.

In some examples, a high-luminance area 302 of the LED die 102 can be defined as an area of the LED die 102 at which the surface luminance 114 is greater than or equal to 80% of a peak surface luminance 114. Other threshold values, such as 50%, 60%, 70%, 75%, 85%, 90%, 95%, 98%, or 99% can also be used. The high-luminance area 202 can be less than or equal to half of the surface area of the LED die 102.

The high-luminance area 302 can have a perimeter 304. A radial separation, extending along a line that passes through the peak of the surface luminance 114, between the perimeter 304 and an edge of the LED die 102 can vary by less than a threshold percentage, such as 20%, of a mean radial separation value around the perimeter 304 of the high-luminance area 302. Other threshold values, such as 40%, 30%, 25%, 15%, 10%, 5%, 2%, or 1% can also be used. In the example of FIG. 3, the radial separations are shown as having values of D1, D2, D3, D4, D5, D6, D7, D8, D9, D10, D11, and D12. The values of D1 through D12 can vary by less than a threshold percentage, such as 20%, of an average value or a mean value of the values D1 through D12. This is but one example; other suitable configurations can also be used.

The illumination system 100 can optionally further include a controller 120 that can cause current to flow across the p-n junction 104 to produce the light with the surface luminance 114 that varies non-uniformly over the surface area of the LED die 102. The illumination system 100 can optionally further include a lens 122 that can collimate the light, such as to direct a specified light distribution 124 toward a target. In some examples, the LED die 102 and lens can be configured as a vehicle headlight, spotlight, flashlight, or other suitable application that can use a direction beam.

Figure 4:
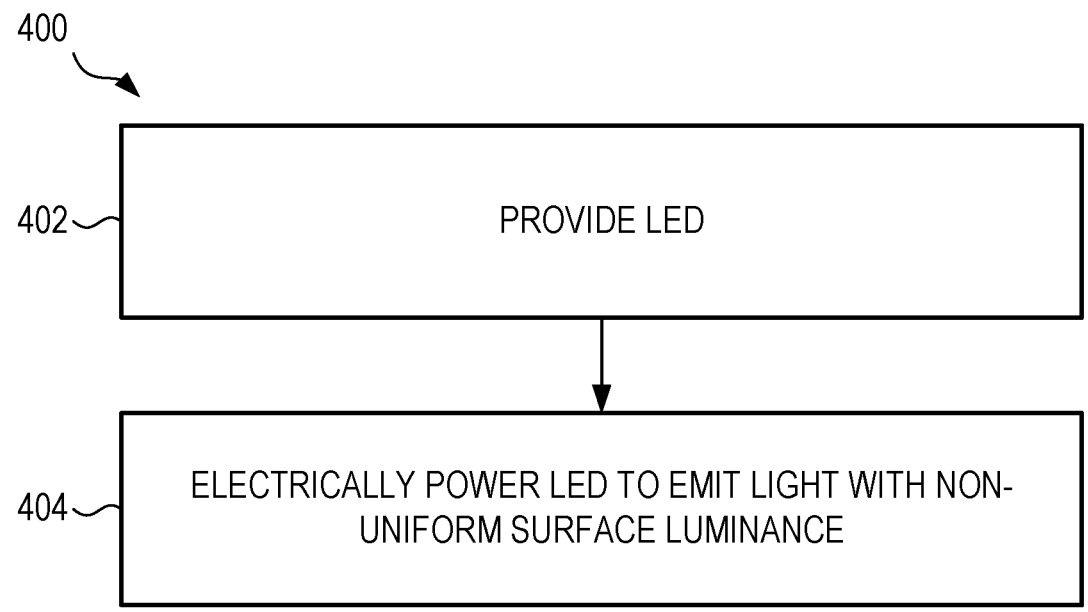
FIG. 4 shows a flowchart of an example of a method for providing illumination, in accordance with some examples.

FIG. 4 shows a flowchart of an example of a method 400 for providing illumination, in accordance with some examples. The method 400 can be executed by illumination system 100, illumination system 200, or another suitable system. The method 400 for providing illumination is but one method for providing illumination; other suitable methods can also be used.

At operation 402, a light-emitting diode (LED) die is provided. The LED die can include a p-n junction between a p-doped semiconductor material and an n-doped semiconductor material. The LED die can include a plurality of p-vias that electrically contact the p-doped semiconductor material. The LED die can include a plurality of n-vias that electrically contact the n-doped semiconductor material. The plurality of p-vias and the plurality of n-vias can be distributed non-uniformly over a surface area of the LED die.

At operation 404, the plurality of p-vias and the plurality of n-vias can be electrically powered to cause the LED die to emit light with a surface luminance that varies non-uniformly over the surface area of the LED die.

In some examples, the p-vias of the plurality of p-vias and the n-vias of the plurality of n-vias can be distributed over the surface area of the LED die with a density that peaks at or near a center of the LED die and decreases with increasing distances away from the peak of the density, such that when the plurality of p-vias and the plurality of n-vias are electrically powered, the LED die emits light with a surface luminance that peaks at or near the center of the LED die and decreases with increasing distances away from the peak of the surface luminance. In some examples, a high-luminance area of the LED die can be defined as an area of the LED die at which the surface luminance is greater than or equal to 80% of a peak surface luminance. The high-luminance area can be less than or equal to half of the surface area of the LED die. The high-luminance area can have a perimeter. A radial separation, extending along a line that passes through the peak of the surface luminance, between the perimeter and an edge of the LED die can vary by less than 20% of a mean radial separation value around the perimeter of the high-luminance area. In some examples, the surface area of the LED die can be a regular hexagon.

It is instructional to discuss how to manufacture such an LED die that can emit light having a non-uniform surface luminance. To create a die of a specified polygonal shapes, such as a hexagon, the die and substrate can be singulated. Methods for die singulation can include scribe and break, stealth dice (e.g., dice using a laser rather than a blade) and break, blade dicing, and laser ablation, among others. Some methods of die singulation can use cuts that are parallel to one another across a wafer. For a regular hexagonal die, the scribe and break can use three different scribe axes, oriented at 120 degrees from one another. Some polygons can use additional techniques in order to prevent scribing through other die on the wafer.

In an example of a manufacturing technique, the active semiconductor area (mesa) can be defined using dry etching (ICP, RIE) through the active region of the epitaxial material in the desired shape (mesa etch). Dry etching in this manner can shaped the active area into a specified spatial distribution, such as a hexagon, octagon, or other n-sided polygon. A second etch can define the epitaxial material boundary (trench etch) that can conform to the mesa boundary. For VTF die or TFFC die, in which the substrate is removed, this technique can be used to define an arbitrarily shaped die. For CSP die, in which the substrate remains on the device, laser cutting or other techniques at the die level or wafer level can remove the excess substrate. With this technique, VTF die or TFFC die can be tiled in a triangular lattice to most efficiently use the full wafer area. CSP die can also be arranged in a triangular lattice configuration and can use laser ablation of the substrate for singulation. Laser ablation can use a higher laser power and wider street widths between die than stealth scribe and break techniques.

Alternatively, in another example of a singulation technique, the scribe/break can skip a parallel scribe/break line, so as not to scribe/break over another die. This approach can use three scribe axes oriented 120 degrees apart and offset to create a central hexagon but skipping every third scribe/break line. Skipping every third scribe/break line can generate a hexagonal die and a border of two additional die shapes (triangle and diamond) that can either be discarded as waste or utilized in other applications to utilize the entire wafer.

In another technique, one can etch the GaN up to a sapphire substrate, and stealth dice the sapphire. To avoid cracks in the sapphire that may extend through other dies, the corners or points of the polygon can first undergo stealth dicing before the straight edges of the polygon. This technique can help prevent a crack from extending beyond the points of the polygon. In particular, the hexagons can be packed in a honeycomb structure, to help reduce or minimize waste of epitaxial material.

To further illustrate the systems and related methods disclosed herein, a non-limiting list of examples is provided below. Each of the following non-limiting examples can stand on its own or can be combined in any permutation or combination with any one or more of the other examples.

In Example 1, an illumination system can include: a light-emitting diode (LED) die that includes a p-n junction between a p-doped semiconductor material and an n-doped semiconductor material, the LED die including a plurality of vias configured to electrically power the p-n junction, the plurality of vias being distributed with a density that peaks at or near a center of the LED die and decreases with increasing distances away from the peak of the density, such that when the plurality of vias are electrically powered, the LED die emits light with a surface luminance that peaks at or near the center of the LED die and decreases with increasing distances away from the peak of the surface luminance.

In Example 2, the illumination system of Example 1 can optionally be configured such that the vias of the plurality of vias are electrically connected in parallel to one another.

In Example 3, the illumination system of any one of Examples 1-2 can optionally be configured such that the vias of the plurality of vias are distributed over the surface area of the LED die in an equilateral triangular pattern.

In Example 4, the illumination system of any one of Examples 1-3 can optionally be configured such that the vias of the plurality of vias are distributed over the surface area of the LED die such that a separation between adjacent vias varies across the LED die by a value greater than or equal to 15% of a smallest via separation value.

In Example 5, the illumination system of any one of Examples 1-4 can optionally be configured such that the LED die includes a central contact pad that is located proximate a center of the LED die, the central contact pad being configured to deliver current to the vias of the plurality of vias and direct heat away from the LED die.

In Example 6, the illumination system of any one of Examples 1-5 can optionally further include an electrically conducting layer that extends at least partially over a surface area of the LED die and is located such that when the plurality of vias are electrically powered, current flows through the p-n junction between the electrically conducting layer and the plurality of vias.

In Example 7, the illumination system of any one of Examples 1-6 can optionally be configured such that: the plurality of vias is a first plurality of vias that electrically contact the n-doped semiconductor material; and the illumination system further comprises a second plurality of vias that electrically contact the p-doped semiconductor material, such that when the plurality of vias are electrically powered, current flows through the p-n junction between the first plurality of vias and the second plurality of vias.

In Example 8, the illumination system of any one of Examples 1-7 can optionally be configured such that the vias of the plurality of vias are n-vias that electrically contact the n-doped semiconductor material.

In Example 9, the illumination system of any one of Examples 1-8 can optionally be configured such that a perimeter of the LED die lacks vias.

In Example 10, the illumination system of any one of Examples 1-9 can optionally be configured such that: a high-luminance area of the LED die is defined as an area of the LED die at which the surface luminance is greater than or equal to 80% of a peak surface luminance; and the high-luminance area is less than or equal to half of the surface area of the LED die.

In Example 11, the illumination system of any one of Examples 1-10 can optionally be configured such that: a high-luminance area of the LED die is defined as an area of the LED die at which the surface luminance is greater than or equal to 80% of a peak surface luminance; the high-luminance area has a perimeter; and a radial separation, extending along a line that passes through the peak of the surface luminance, between the perimeter and an edge of the LED die varies by less than 20% of a mean radial separation value around the perimeter of the high-luminance area.

In Example 12, the illumination system of any one of Examples 1-11 can optionally be configured such that the surface area of the LED die is a regular hexagon.

In Example 13, the illumination system of any one of Examples 1-12 can optionally further include: a controller configured to cause current to flow across the p-n junction via the plurality of vias to produce the light with the surface luminance that varies non-uniformly over the surface area of the LED die; and a lens configured to collimate the light.

In Example 14, the illumination system of any one of Examples 1-13 can optionally be configured such that the LED die and lens are configured as one of a vehicle headlight, a spotlight, or a flashlight.

In Example 15, an illumination system can include: a light-emitting diode (LED) die configured to emit light with a surface luminance that varies over a surface area of the LED die, the surface luminance peaking at or near a center of the LED die and decreasing with increasing distances away from the peak of the surface luminance, a high-luminance area of the LED die being defined as an area of the LED die at which the surface luminance is greater than or equal to 80% of a peak surface luminance, the high-luminance area being less than or equal to half of the surface area of the LED die, the high-luminance area having a perimeter, a radial separation, extending along a line that passes through the peak of the surface luminance, between the perimeter and an edge of the LED die varying by less than 20% of a mean radial separation value around the perimeter of the high-luminance area.

In Example 16, the illumination system of Example 15 can optionally be configured such that the surface area of the LED die is shaped as a regular hexagon.

In Example 17, the illumination system of any one of Examples 15-16 can optionally be configured such that: the LED includes a p-n junction between a p-doped semiconductor material and an n-doped semiconductor material; the LED die includes a plurality of vias configured to electrically power the p-n junction; and the plurality of vias are distributed over the surface area of the LED die with a density that peaks at or near a center of the LED die and decreases with increasing distances away from the peak of the density.

In Example 18, an illumination system can include: a light-emitting diode (LED) die that includes a p-n junction between a p-doped semiconductor material and an n-doped semiconductor material, the LED die including a plurality of vias electrically connected in parallel to one another and configured to electrically power the p-n junction, the plurality of vias being distributed non-uniformly over a surface area of the LED die with a density that peaks at or near a center of the LED die and decreases with increasing distances away from the peak of the density, such that when the plurality of vias are electrically powered, the LED die emits light with a surface luminance that peaks at or near the center of the LED die and decreases with increasing distances away from the peak of the surface luminance, a high-luminance area of the LED die being defined as an area of the LED die at which the surface luminance is greater than or equal to 80% of a peak surface luminance, the high-luminance area being less than or equal to half of the surface area of the LED die, the high-luminance area having a perimeter, a radial separation, extending along a line that passes through the peak of the surface luminance, between the perimeter and an edge of the LED die varying by less than 20% of a mean radial separation value around the perimeter of the high-luminance area.

In Example 19, the illumination system of Example 18 can optionally be configured such that the surface area of the LED die is shaped as a regular hexagon.

In Example 20, the illumination system of any one of Examples 18-19 can optionally further include an electrically conducting layer that extends at least partially over a surface area of the LED die and is located such that when the plurality of vias are electrically powered, current flows through the p-n junction between the electrically conducting layer and the plurality of vias.

While only certain features of the system and method have been illustrated and described herein, many modifications and changes will occur to those skilled in the art. It is, therefore, to be understood that the appended claims are intended to cover all such modifications and changes. Method operations can be performed substantially simultaneously or in a different order.

What is claimed is:
1. An illumination system, comprising:
   a light-emitting diode (LED) die that includes a p-n junction between a p-doped semiconductor material and an n-doped semiconductor material,
   the LED die including a plurality of vias configured to electrically power the p-n junction,
   the plurality of vias being distributed with a density that peaks at or near a center of the LED die and decreases with increasing distance from the peak of the density, such that when the plurality of vias is electrically powered, the LED die emits light with a surface luminance that peaks at or near the center of the LED die and decreases with increasing distance from the peak of the surface luminance.
2. The illumination system of claim 1, wherein the vias of the plurality of vias are electrically connected in parallel to one another.
3. The illumination system of claim 1, wherein the vias of the plurality of vias are distributed over the surface area of the LED die in an equilateral triangular pattern.

4. The illumination system of claim 1, wherein the vias of the plurality of vias are distributed over the surface area of the LED die such that a separation between adjacent vias varies across the LED die by a value greater than or equal to 15% of a smallest via separation value.

5. The illumination system of claim 1, wherein the LED die includes a central contact pad that is located proximate a center of the LED die, the central contact pad being configured to deliver current to the vias of the plurality of vias and direct heat away from the LED die.

6. The illumination system of claim 1, further comprising an electrically conducting layer that extends at least partially over a surface area of the LED die and is located such that when the plurality of vias are electrically powered, current flows through the p-n junction between the electrically conducting layer and the plurality of vias.

7. The illumination system of claim 1, wherein:
the plurality of vias is a first plurality of vias that electrically contact the n-doped semiconductor material; and
the illumination system further comprises a second plurality of vias that electrically contact the p-doped semiconductor material, such that when the plurality of vias are electrically powered, current flows through the p-n junction between the first plurality of vias and the second plurality of vias.

8. The illumination system of claim 1, wherein the vias of the plurality of vias are n-vias that electrically contact the n-doped semiconductor material.

9. The illumination system of claim 1, wherein a perimeter of the LED die lacks vias.

10. The illumination system of claim 1, wherein:
a high-luminance area of the LED die is defined as an area of the LED die at which the surface luminance is greater than or equal to 80% of a peak surface luminance; and
the high-luminance area is less than or equal to half of the surface area of the LED die.

11. The illumination system of claim 1, wherein:
a high-luminance area of the LED die is defined as an area of the LED die at which the surface luminance is greater than or equal to 80% of a peak surface luminance;
the high-luminance area has a perimeter; and
a radial separation, extending along a line that passes through the peak surface luminance, between the perimeter and an edge of the LED die varies by less than 20% of a mean radial separation value around the perimeter of the high-luminance area.

12. The illumination system of claim 1, wherein the surface area of the LED die is a regular hexagon.

13. The illumination system of claim 1, further comprising:
a controller configured to cause current to flow across the p-n junction via the plurality of vias to produce the light with the surface luminance that varies non-uniformly over the surface area of the LED die; and
a lens configured to collimate the light.

14. The illumination system of claim 13, wherein the LED die and lens are configured as one of a vehicle headlight, a spotlight, or a flashlight.

15. An illumination system, comprising:
a light-emitting diode (LED) die configured to emit light with a surface luminance that varies over a surface area of the LED die,
the surface luminance peaking at or near a center of the LED die and decreasing with increasing distance from the peak of the surface luminance,
a high-luminance area of the LED die being defined as an area of the LED die at which the surface luminance is greater than or equal to 80% of a peak surface luminance,
the high-luminance area being less than or equal to half of the surface area of the LED die,
the high-luminance area having a perimeter,
a radial separation, extending along a line that passes through the peak of the surface luminance, between the perimeter and an edge of the LED die varying by less than 20% of a mean radial separation value around the perimeter of the high-luminance area.

16. The illumination system of claim 15, wherein the surface area of the LED die is shaped as a regular hexagon.

17. The illumination system of claim 15, wherein:
the LED includes a p-n junction between a p-doped semiconductor material and an n-doped semiconductor material;
the LED die includes a plurality of vias configured to electrically power the p-n junction; and
the plurality of vias are distributed over the surface area of the LED die with a density that peaks at or near a center of the LED die and decreases with increasing distances away from the peak of the density.

18. An illumination system, comprising:
a light-emitting diode (LED) die that includes a p-n junction between a p-doped semiconductor material and an n-doped semiconductor material,
the LED die including a plurality of vias electrically connected in parallel to one another and configured to electrically power the p-n junction,
the plurality of vias being distributed non-uniformly over a surface area of the LED die with a density that peaks at or near a center of the LED die and decreases with increasing distances away from the peak of the density, such that when the plurality of vias are electrically powered, the LED die emits light with a surface luminance that peaks at or near the center of the LED die and decreases with increasing distances away from the peak of the surface luminance,
a high-luminance area of the LED die being defined as an area of the LED die at which the surface luminance is greater than or equal to 80% of a peak surface luminance,
the high-luminance area being less than or equal to half of the surface area of the LED die,
the high-luminance area having a perimeter,
a radial separation, extending along a line that passes through the peak of the surface luminance, between the perimeter and an edge of the LED die varying by less than 20% of a mean radial separation value around the perimeter of the high-luminance area.

19. The illumination system of claim 18, wherein the surface area of the LED die is shaped as a regular hexagon.

20. The illumination system of claim 18, further comprising an electrically conducting layer that extends at least partially over a surface area of the LED die and is located such that when the plurality of vias are electrically powered, current flows through the p-n junction between the electrically conducting layer and the plurality of vias.

* * * * *